(12) United States Patent
Sakai

(10) Patent No.: US 8,367,938 B2
(45) Date of Patent: Feb. 5, 2013

(54) METHOD OF BONDING CORE WIRES TO ELECTRODES AND ELECTRONIC UNIT FORMED BY BONDING ELECTRODES AND CORE WIRES

(75) Inventor: Tadahiko Sakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 273 days.

(21) Appl. No.: 12/595,682

(22) PCT Filed: Jun. 18, 2008

(86) PCT No.: PCT/JP2008/061508
§ 371 (c)(1),
(2), (4) Date: Oct. 13, 2009

(87) PCT Pub. No.: WO2008/156200
PCT Pub. Date: Dec. 24, 2008

(65) Prior Publication Data
US 2010/0200282 A1    Aug. 12, 2010

(30) Foreign Application Priority Data
Jun. 20, 2007   (JP) ................ P2007-162072

(51) Int. Cl.
*H05K 1/09* (2006.01)
*B32B 38/10* (2006.01)
(52) U.S. Cl. ........ 174/257; 174/250; 174/256; 156/247; 156/60
(58) Field of Classification Search .. 228/180.21–180.5, 228/111.5; 156/247, 60; 174/257, 250, 256; 438/612
See application file for complete search history.

(56) References Cited

U.S. PATENT DOCUMENTS
(Continued)

FOREIGN PATENT DOCUMENTS

| EP | 0 651 463 A2 | 5/1995 |
|---|---|---|
| JP | 7130225 A | 5/1995 |
| JP | 08-186156 A | 7/1996 |
| JP | 09-057436 A | 3/1997 |
| JP | 11-203938 A | 7/1999 |
| JP | 2006-122913 A | 5/2006 |
| JP | 2007-149815 A | 6/2007 |
| WO | 2007/061125 A1 | 5/2007 |

OTHER PUBLICATIONS

Anonymous; "Fine pitch cable/connector attachment method" Research Disclosure, Mason Publications, Hampshire, GB vol. 320, No. 10 Dec. 1, 1990. International Search Report for PCT/JP2008/061508.
Japanese Office Action regarding Patent Application No. 2007-162072.

*Primary Examiner* — Angel R Estrada
*Assistant Examiner* — Dimary Lopez
(74) *Attorney, Agent, or Firm* — Pearne & Gordon LLP

(57) ABSTRACT

A method of bonding electrodes and core wires capable of shortening the operation time and improving the bonding strength and an electronic unit formed by bonding the electrodes and the core wires are intended to be provided.
After supplying a thermosetting resin 8a incorporated with solder particles 7a so as to cover a plurality of electrodes 3 on a substrate 2, arranging each of core wires 6 while opposing vertically to each of the electrodes 3 above the substrate 2, locating a sheet member 11 above the core wires 6, hot pressing each of the core wires 6 and the thermosetting resin 8a by way of the sheet member 11 by hot press bonding tool 12 from above the sheet member 11 to thermally cure the thermosetting resin 8a and melt the solder particles 7a contained in the thermosetting resin 8a, detaching the hot press bonding tool 12 from the thermally cured product 8 of the thermosetting resin 8a, bonding the core wires 6 and the electrodes 3 by the solidification product 7 of solder formed by solidification of a molten product of the solder particles (molten solder 7b) and, finally, peeling the sheet member 11 from the thermally cured product 8.

4 Claims, 6 Drawing Sheets

U.S. PATENT DOCUMENTS

| | | | |
|---|---|---|---|
| 4,735,847 A * | 4/1988 | Fujiwara et al. | 428/209 |
| 5,478,008 A | 12/1995 | Takahashi | |
| 6,051,778 A * | 4/2000 | Ichinose et al. | 136/256 |
| 6,657,119 B2 * | 12/2003 | Lindquist et al. | 136/251 |
| 6,706,961 B2 * | 3/2004 | Shimizu et al. | 136/256 |
| 7,090,482 B2 * | 8/2006 | Tsukahara et al. | 425/149 |
| 7,238,548 B2 * | 7/2007 | Kurita et al. | 438/110 |
| 7,247,508 B2 * | 7/2007 | Higashitani et al. | 438/17 |
| 7,683,482 B2 * | 3/2010 | Nishida et al. | 257/737 |
| 8,007,627 B2 * | 8/2011 | Nishida et al. | 156/306.6 |
| 2006/0196600 A1 | 9/2006 | Nam et al. | |
| 2009/0075025 A1 | 3/2009 | Ozono et al. | |

* cited by examiner

METHOD OF BONDING CORE WIRES TO ELECTRODES AND ELECTRONIC UNIT FORMED BY BONDING ELECTRODES AND CORE WIRES

TECHNICAL FIELD

The present invention relates to a method of bonding core wires to electrodes in that a plurality of core wires of covered conductor wires disposed to an electronic component to a plurality of electrodes arranged on a substrate, and an electronic unit formed by bonding the electrodes and core wires.

BACKGROUND ART

As a method of bonding electrodes arranged on a substrate and core wires of covered conductor wires disposed to an electronic component, a method of using a soldering iron has been known. In the method of bonding electrodes and core wires by using a soldering iron, solder heat-melted by the soldering iron is supplied to an overlapped portion of the electrode and the core wire and then the solder is cooled to solidify to bond the electrode and the core wire mechanically and electrically (Patent Document 1).

[Patent Document 1] Japanese Unexamined Patent Publication JP-A-9-57436

DISCLOSURE OF THE INVENTION

Technical Problem

However, in the method of using the soldering iron as described above, in a case where there are a plurality of portions to be bonded between the electrodes and the core wires, since it is necessary to bond the core wires one by one to a plurality of electrodes, it involves a problem that an operation time is long. Further, while the electrode and the core wire are bonded with a solidification product of the solder not only electrically but also mechanically, the bonding strength is not so high to result in a problem of tending to cause failure.

In view of the above, the present invention intends to provide a method of bonding electrodes and core wires capable of shortening the operation time and improving the bonding strength, and an electronic unit formed by bonding the electrodes and the core wires.

Technical Solution

According to the first aspect of the present invention, a method of bonding electrodes and core wires of bonding a plurality of core wires of covered conductor wires disposed to an electronic component to a plurality of electrodes arranged on a substrate, wherein the bonding method includes a resin supplying step of supplying a thermosetting resin incorporated with solder particles to a substrate with electrodes being upwarded so as to cover the plurality of electrodes, a core wire arranging step of arranging each of the core wires above the substrate supplied with the thermosetting resin being opposed vertically to each of the electrodes, a sheet member arranging step of arranging a sheet member above the plurality of core wires arranged being opposed to the electrodes respectively, a hot press bonding step of hot pressing each of the core wires and the thermosetting resin by way of the sheet member by a hot press bonding tool from above the sheet member thereby thermally curing the thermosetting resin and melting the solder particles contained in the thermosetting resin, a cooling step of detaching the hot press bonding tool from the thermally cured product of the thermosetting resin thereby cooling the thermally cured product and bonding the electrodes and the core wires by the solidification product of the solder formed by solidification of molten products of the solder particles and a sheet member peeling step of peeling the sheet member from the thermally set product.

Preferably, each of the core wires comprises twisted wires formed by twisting a plurality of fine conductor wires to each other and the molten product of the solver particles is solidified in a wet and spread state along a grooved portion between each of the fine conductor wires.

According to second aspect of the invention, an electronic unit formed by bonding electrodes and core wires includes a substrate on which a plurality of electrodes are arranged, an electronic component having core wires of a plurality of covered conductor wires to be bonded with a plurality of electrodes on the substrate, a thermally cured product of a thermosetting resin incorporated with solder particles for securing each of the core wires to the substrate, and a solidification product of the solder for bonding each of the electrodes and each of the core wires, in which the solidification product of the solder comprises solder particles contained in the thermosetting resin which are melted and solidified.

Preferably, the upper surface of the core wire secured to the substrate and the upper surface of the thermally cured product constitute a flat surface of an identical height.

Advantageous Effects

In the present invention, since a thermosetting resin incorporated with solder particles is supplied to the substrate, each of the electrode and each of the core wires are opposed vertically and a thermosetting resin is hot pressed by a hot press bonding tool by way of a sheet member thereby thermally curing the thermosetting resin to secure each of the core wires to the substrate and bonding the electrodes and the core wires by the solidification product of the solder formed by solidification of the molten product of the solder particles contained in the thermosetting resin, bonding portions for the electrode and the core wire, if present in plurality, can be bonded collectively to shorten the operation time. Further, since each of the core wires is not only bonded and secured to the electrode by the solidification product of the solder but also secured firmly to the substrate by the thermally cured product of the thermosetting resin, the bonding strength at the bonding portion can be improved.

BEST MODE FOR CARRYING OUT THE INVENTION

Embodiment 1

Figure 1:
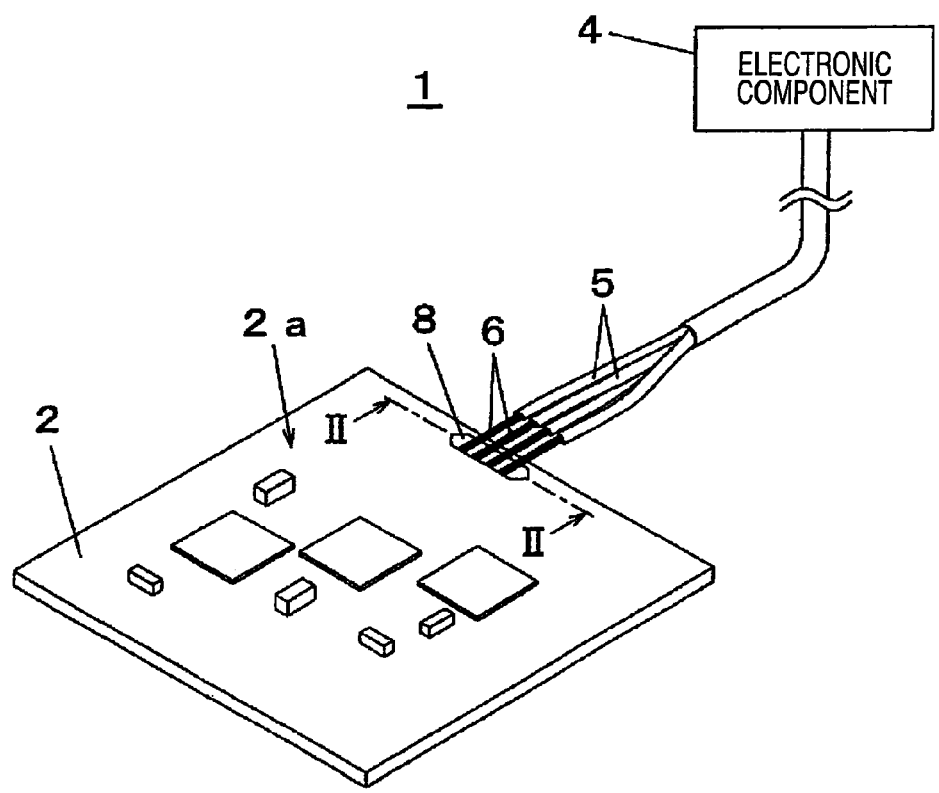
FIG. 1 is a perspective view of an electronic unit in a first embodiment of the invention.
Figure 2A:
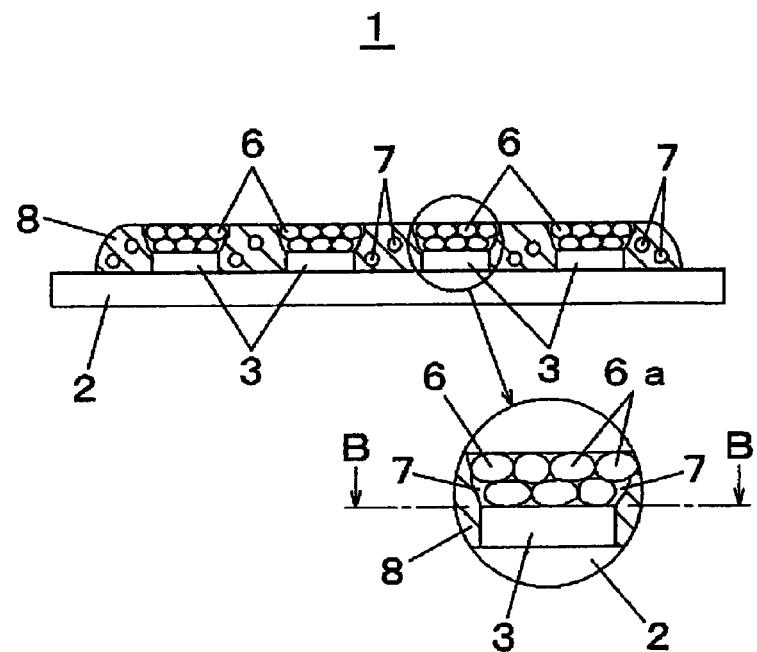
FIGS. 2A and 2B are cross sectional views for the bonding portion of electrodes and core wires of an electronic unit in the first embodiment of the invention.
Figure 2B:
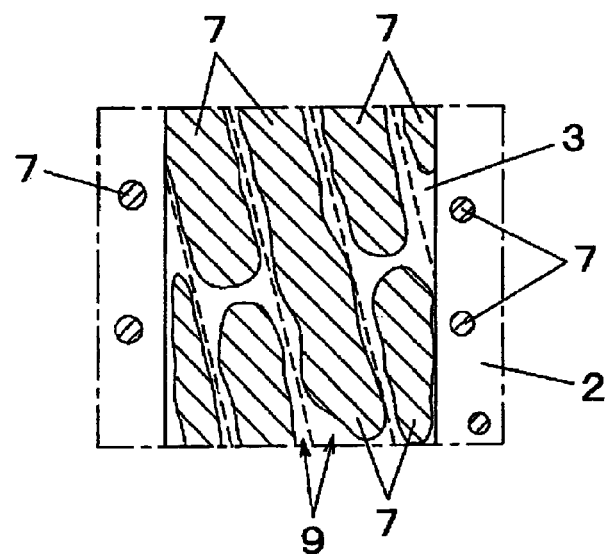
Figure 3:
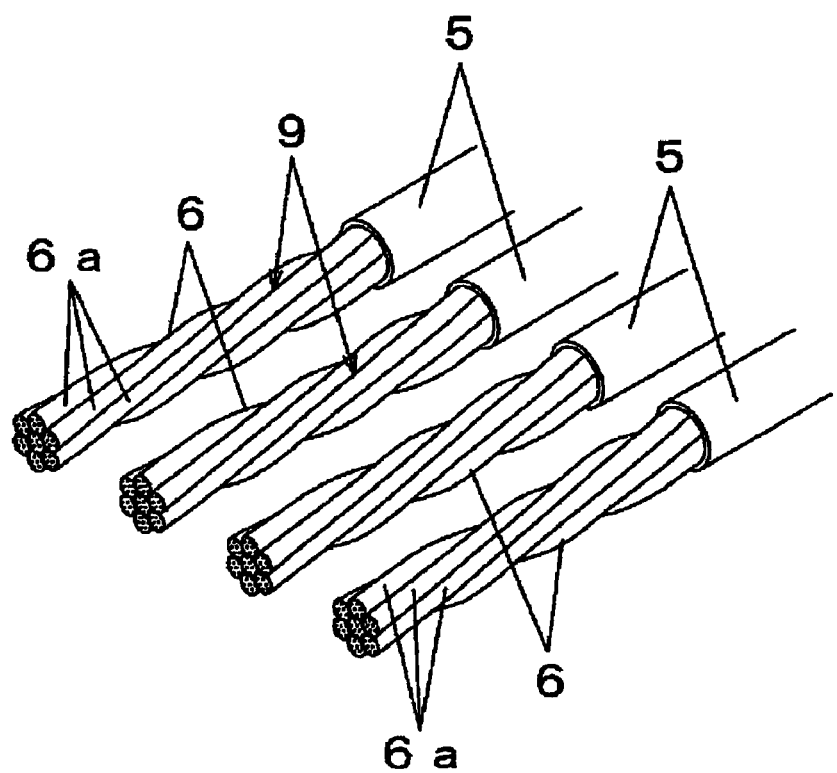
FIG. 3 is a perspective view of a covered conductor wire in the first embodiment of the invention.
Figure 4:
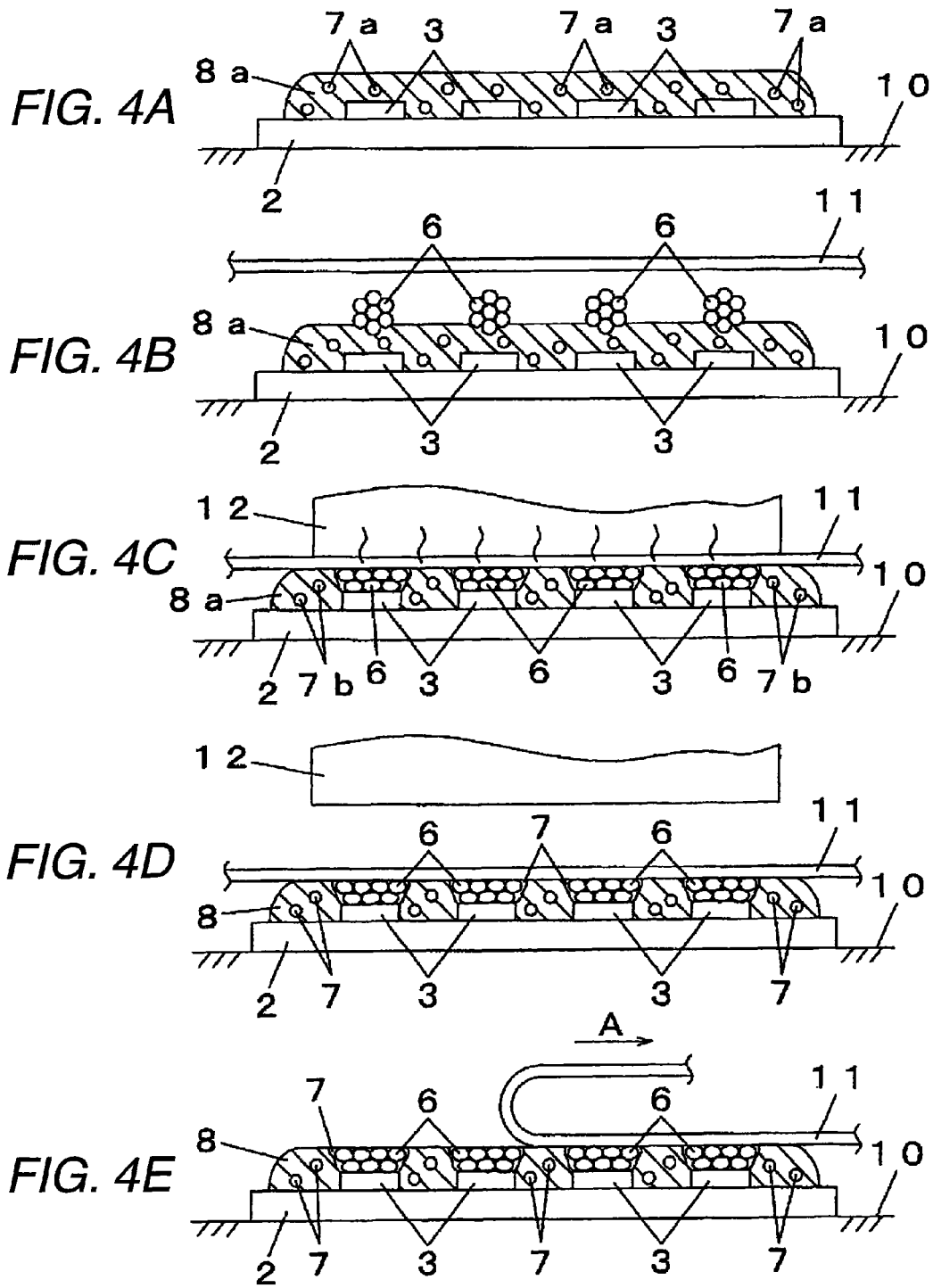
FIGS. 4A to 4E are explanatory views for the bonding step of electrodes and core wires in the first embodiment 1 of the invention.

In FIG. 1 and FIGS. 2A and 2B (FIG. 2A is a cross sectional view indicated by arrows II-II in FIG. 1, FIG. 2B is a cross sectional view indicated by arrows B-B in FIG. 2A), an electronic unit 1 is formed by bonding a plurality of electrodes 3 arranged on a substrate 2 and core wires 6 of a plurality of covered conductor wires 5 disposed to an electronic component 4, in which each of the core wires 6 is firmly secured to the substrate 2 by thermally cured product 8 of a thermosetting resin 8a incorporated with solder particles 7a thermally cured on the substrate 2 (refer to FIG. 4A). In the inside of the thermally cured product 8, a solidification product 7 of the solder formed by solidification of molten product of solder particles 7a contained in the thermosetting resin 8a (molten solder 7b) is dispersed, and the electrodes 3 and core wires 6 are bonded by the solidification product 7 of the solder formed by solidification of the molten solder product 7b between the electrodes 3 and the core wires 6. In this embodiment, the core wire 6 comprises a twisted wire formed by twisting a plurality of fine conductor wires 6a to each other as shown in FIG. 3, and the electrode 3 and the core wire 6 are bonded mainly by the solidification product 7 of the solder formed by solidification of the molten solder 7b in a grooved portion 9 between each of the fine conductor wires 6a.

A method of bonding the electrode and the core wire (between electrode 3 and core wire 6) is to be described with reference to FIGS. 4A to 4E. At first, a substrate 2 with electrodes 3 being upwarded is placed on a stage 10 for a hot press bonding operation, and a thermosetting resin 8a incorporated with solder particles 7a is supplied on the substrate 2 (FIG. 4A: resin supply step). In this case, all the plurality of electrodes 3 on the substrate 2 are covered with the thermosetting resin 8a. The thermosetting resin 8a incorporated with the solder particles 7a supplied on the substrate 2 may be in a liquid form or fabricated into a sheet-like shape.

After supplying the thermosetting resin 8a on the substrate 2, plurality of core wires 6 of covered conductor wires 5 of the electronic component 4 are arranged at an interval identical with that between the electrodes 3 on the substrate 2 and then each of the core wires 6 is arranged being opposed vertically to each of the electrodes 3 (core wire arranging step). In this case, when the thermosetting resin 8a is liquid, the core wire 6 can be set provisionally by arranging each of the core wires 6 in a state immersed in the thermosetting resin 8a till the hot press bonding step (to be described later) (FIG. 4B). Then, a sheet member 11 comprising a heat resistant material such as Teflon (registered trade mark) is located above the plurality of the core wires 6 which are arranged being opposed to the electrodes 3 respectively (sheet member arranging step: FIG. 4B). Then, each of the core wires 6 is pressed to each of the electrodes 3 by way of the sheet member 11 and the thermosetting resin 8a is hot pressed on the substrate 2 by a hot press bonding tool 12 lowered to the heat member 11 (FIG. 4C: hot press bonding step). By the hot pressing of the thermosetting resin 8a, the thermosetting resin 8a is a thermally cured into thermally cured product 8, and each of the core wires 6 is firmly secured by the thermally cured product 8 to the substrate 2. In the hot press bonding step, since the hot press bonding tool 12 hot presses the thermosetting resin 8a by way of the sheet member 11, there is no worry of contaminating the hot pressing bonding tool 12 by deposition of the thermosetting resin 8a.

In the hot press bonding step, the solder particles 7a contained in the thermosetting resin 8a are melted into the molten solder 7b and a portion of the molten solder of 7b is wetted and spread into the grooved portion 9 of the core wires 6 (refer to FIG. 2B).

In this case, since the grooved portion 9 extends entirely in the extending direction of the core wires 6, even in a case where the thermosetting resin 8a is pressed and a vertical compressive force exerts, the molten solder 7b in the grooved portion 9 is spread and by wetting mainly in the extending direction of the core wire 6 and does not flow so much to in the direction to other adjacent core wires 6 or electrodes 3 (direction where the electrodes 3 are arranged side by side). Accordingly, the molten solder 7b in an amount sufficient to bonding of the electrode 3 and core wire 6 is ensured between both of the electrode 3 and the core wire 6.

When the thermosetting resin is thermally cured into the thermally cured product 8, the hot press bonding tool 12 is detached from the sheet member 11 and pulled upward and the thermally cured product 8 is cooled to a normal temperature (FIG. 4D: cooling step). Thus, the molten solder 7b formed in the thermosetting resin 8a is solidified into the solder solidification product 7 of the solder. The electrode 3 and the core wire 6 are bonded by the solidification of the molten solder 7b between the electrode 3 and the core wire 6 and, since the sufficient amount of the molten solder 7b to the bonding of the electrode 3 and the core wire 6 is ensured in the grooved portion 9 as described above, the electrode 3 and the core wire 6 are reliably bonded by the sufficient amount of the solidification product of the molten solder 7b (solidification product 7 of solder). Further, since the molten solder 7b is wetted and spread along the grooved portion 9 and solidified, the area of contact of the solder to the electrode 3 and the core wire 6 is enlarged thereby enabling to attain a bonding state with high bonding strength and low electric resistance. When the thermally cured product 8 is sufficiently cooled, the sheet member 11 adhered to the upper surface of the thermally cured product 8 is peeled by being pulled in the direction of an arrow A in FIG. 4E (FIG. 4E: sheet member cooling step). Thus, the bonding step for the electrode-core wire is completed.

As described above, in the bonding method for the electrodes and core wires in this embodiment, since the thermosetting resin 8a incorporated with the solder particles 7a is supplied to the substrate 2, each of the electrode 3 and each of the core wires 6 are opposed vertically, and the thermosetting resin 8a is hot pressed by the hot press bonding tool 12 by way of the sheet member 11 thereby thermally curing the thermosetting resin 8a to secure each of the core wires 6 to the substrate 2 and bond the electrode 3 and the core wire 6 by the solidification product 7 of the solder formed by solidification of the molten product of the solder particles 7a (molten solder 7b) contained in the thermosetting resin 8a, the electrodes 3 and the core wires 6 can be bonded even at a plurality of bonding portions, and they can be bonded collectively to shorten the operation time. Further, since each of the core wires 6 is not only bonded and secured by the solidification product 7 of the solder to the electrode 3 but also secured firmly to the substrate 2 by the thermally cured product 8 of the thermosetting resin 8a, the bonding strength at the bonding portion can be improved.

Further, in the electronic unit 1 in which the electrodes 3 and the core wires 6 bonded by the bonding method for the electrode-core wire as described above, the upper surface for each of the core wires 6 secured to the substrate 2 and the upper surface of the thermosetting resin 8 constitute a flat surface of an identical height (refer to FIG. 2A) by pressing of the hot press bonding tool 12. Accordingly, the thickness for the bonding portion of the electrodes and core wires can be decreased to less than the usual case where the solder was raised by a soldering iron. In addition, since the core wire 6 is secured by the solidification product 7 of the solder and the thermally cured product 8 to the substrate 2, a sufficient bonding strength can be ensured even at a reduced thickness. Further, since the upper surface of the bonding portion can be made flat, an electronic unit 1 that can be assembled easily into an electronic equipment which is decreased in the weight and the thickness can be attained.

Embodiment 2

Figure 5:
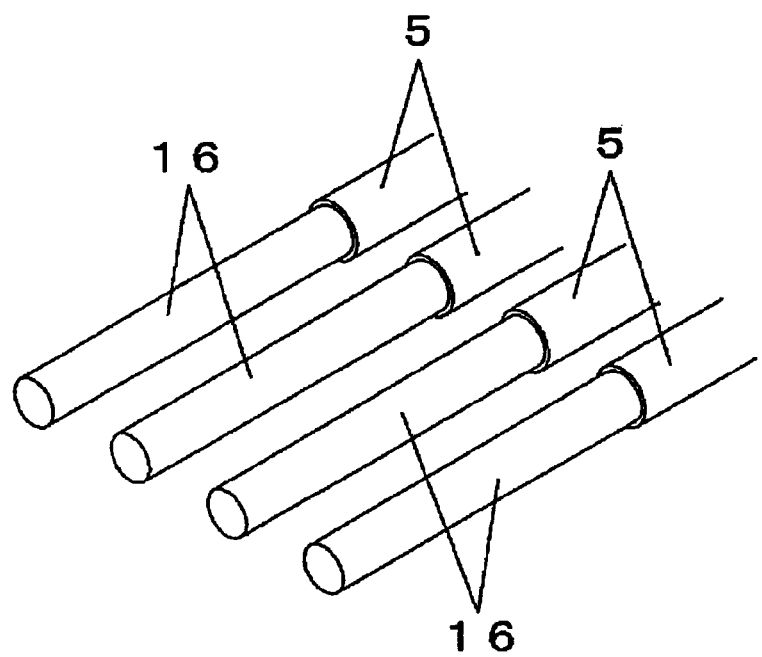
FIG. 5 is a cross sectional view for a bonding portion of electrodes and core wires in a second embodiment of the invention.
Figure 6:
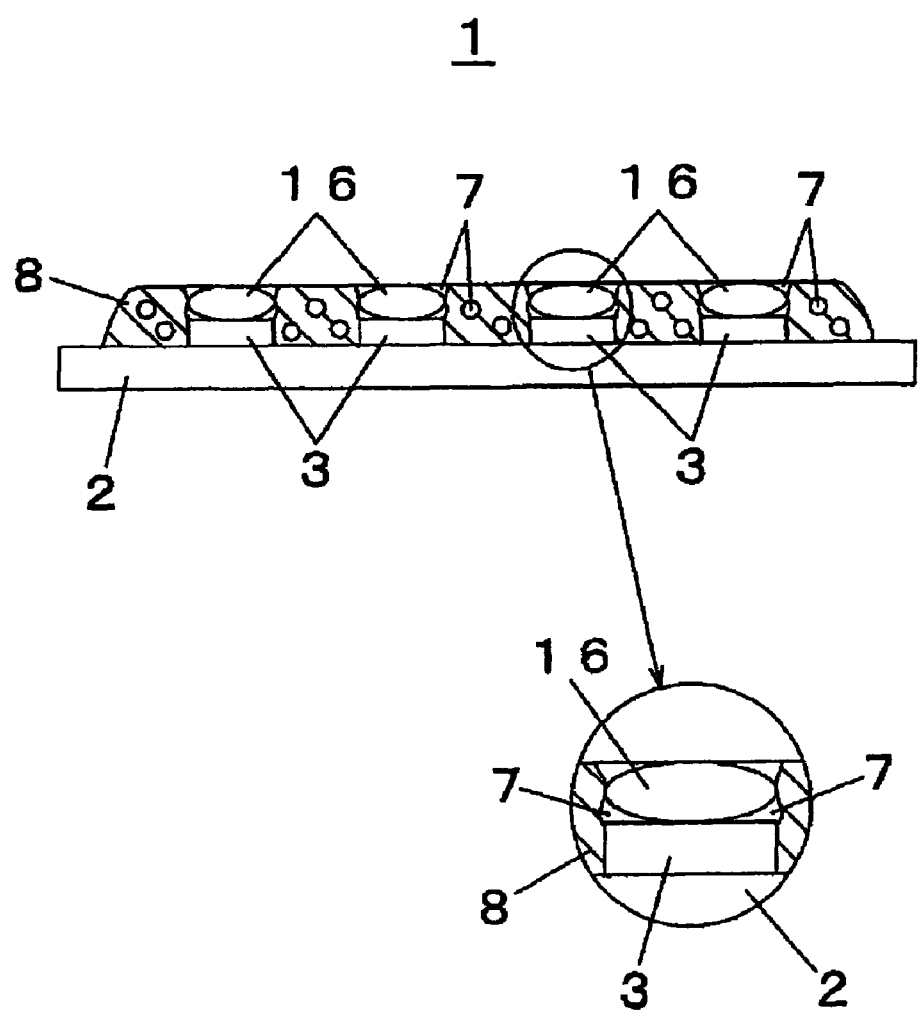
FIG. 6 is a perspective view of a covered conductor wire in a second embodiment of the invention.

FIG. 5 is a cross sectional view for a bonding portion of electrodes and core wires of an electronic unit in an Embodiment 2 of the invention and FIG. 6 is a perspective view of covered conductor wires in the Embodiment 2 of the invention. In the Embodiment 2, of the invention. As shown in FIG. 5, while a core wire 16 of a covered conductor wire 5 is not a twisted wire formed by twisting a plurality of fine conductor wires but a single conductor wire, this can be bonded to the electrode 3 on the substrate 2 by the same steps as in the first embodiment (FIG. 6) and can provide the same effect as in the first embodiment. However, in a case where the core wire 6 comprises the twisted wire formed by twisting a plurality of fine conductor wires 6a and the molten product of the solder particles 7a contained in the thermosetting resin 8a (molten solder 7b) is solidified in a state wetted and spread along the grooved portion 9 between each of the fine conductor wires 6a, this can provide a merit capable of collecting a more amount of solidification product 7 of the solder to the bonding portion of the electrode-core wire.

This application is based upon and claims the benefit of priority of Japanese Patent Application No. 2007-162072 filed on Jun. 20, 2007, the contents of which are incorporated herein by reference in its entirety.

INDUSTRIAL APPLICABILITY

According to the present invention, the operation time can be shortened and the bonding strength can be improved.

The invention claimed is:

1. An electronic unit formed by bonding electrodes and core wires, comprising:
    a substrate on which a plurality of electrodes are arranged;
    an electronic component having a plurality of core wires covered conductor wires to be bonded with a plurality of electrodes on the substrate; and
    a thermally cured product of a thermosetting resin for securing each of the core wires to the substrate,
    wherein the thermally cured product comprises a solidification product for bonding each of the electrodes and each of the core wires, and wherein the solidification product comprises solder particles which are melted and solidified,
    wherein each of the electrodes and each of the core wires are spaced apart, and
    wherein the thermally cured product is dispersed completely in between each of the core wires.

2. An electronic unit formed by bonding electrodes and core wires according to claim 1, wherein the upper surface of the core wire secured to the substrate and the upper surface of the thermally cured product constitute a flat surface of an identical height.

3. A method of bonding electrodes and core wires of bonding core wires of a plurality of covered conductor wires disposed to an electronic component to a plurality of electrodes arranged on a substrate, the method comprising;
    a resin supplying step of supplying a thermosetting resin incorporated with solder particles to a substrate with electrodes being upwarded so as to cover a plurality of electrodes;
    a core wire arranging step of arranging each of the core wires being opposed vertically to each of the electrodes above the substrate supplied with the thermosetting resin and arranging each of the electrodes and each of the core wires being spaced apart so that the thermally cured product is dispersed completely in between each of the core wires;
    a sheet member arranging step of arranging a sheet member above the plurality of core wires which are arranged being opposed to the electrodes respectively;
    a hot press bonding step of hot pressing each of the core wires and the thermosetting resin by way of the sheet member by a hot press bonding tool from above the sheet member thereby thermally curing the thermosetting resin and melting the solder particles contained in the thermosetting resin;
    a cooling step of detaching the hot press bonding tool from the thermally cured product of the thermosetting resin thereby cooling the thermally cured product to bond the electrode and the core wire by the solidification product of the solder formed by solidification of the molten product of the solder particles; and
    a sheet member peeling step of peeling the sheet member from the thermally cured product.

4. A method of bonding electrodes and core wires according to claim 3, wherein each of the core wires comprises a twisted wire formed by twisting a plurality of fine conductor wires, and the molten product of the solder particles is solidified in a wet and spread state along a grooved portion between each of the fine conductor wires.

* * * * *